United States Patent
Pu et al.

(10) Patent No.: US 10,871,645 B2
(45) Date of Patent: Dec. 22, 2020

(54) PHASE CONTROL DEVICE AND METHOD FOR MULTI-RESONANCE SYSTEM

(71) Applicant: MICROSOFT TECHNOLOGY LICENSING, LLC, Redmond, WA (US)

(72) Inventors: Chuan Pu, Foster City, CA (US); Wenjun Liao, Nashville, TN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 270 days.

(21) Appl. No.: 15/959,696

(22) Filed: Apr. 23, 2018

(65) Prior Publication Data
US 2019/0324263 A1 Oct. 24, 2019

(51) Int. Cl.
| G02B 26/08 | (2006.01) |
| H03L 7/093 | (2006.01) |
| H03L 7/08 | (2006.01) |
| G02B 26/10 | (2006.01) |
| H03L 7/099 | (2006.01) |
| H02N 2/02 | (2006.01) |

(52) U.S. Cl.
CPC ....... G02B 26/0858 (2013.01); G02B 26/101 (2013.01); H03L 7/0802 (2013.01); H03L 7/093 (2013.01); H03L 7/099 (2013.01); H02N 2/02 (2013.01)

(58) Field of Classification Search
CPC ... G02B 26/0858; G02B 26/101; H03L 7/093; H03L 7/0802; H03L 7/099; H03L 7/00; H02N 2/02; H03J 1/00
USPC ...................................................... 359/199.4
See application file for complete search history.

(56) References Cited

U.S. PATENT DOCUMENTS

2016/0341955 A1* 11/2016 McVittie ............ G02B 26/0841

FOREIGN PATENT DOCUMENTS

WO 2016186804 A1 11/2016

OTHER PUBLICATIONS

"International Search Report and Written Opinion Issued in PCT Application No. PCT/US2019/026208", dated Jun. 25, 2019, 11 Pages.
Pham, et al., "Position Sensing and Electrostatic Actuation Circuits for 2-D Scanning MEMS Micromirror", In Proceedings of the 2011 Defense Science Research Conference and Expo, Aug. 3, 2011, 4 Pages.
Yan, et al., "The Phase Locked Loop for MEMS Horizontal Scanning Control of Micro-laser Projection ASIC", In Proceedings of the 2011 International Symposium on Integrated Circuits, Dec. 12, 2011, pp. 468-471.

* cited by examiner

Primary Examiner — Euncha P Cherry
(74) Attorney, Agent, or Firm — NovoTechIP International PLLC

(57) ABSTRACT

A resonance system is disclosed, which includes a first resonance device configured to receive a drive signal and generate an output signal, a second resonance device configured to receive a control signal and generate the drive signal based on the received control signal, and a controller configured to generate the control signal based on the output signal such that a phase difference between the control signal applied to the second resonance device and the output signal of the first resonance device corresponds to a predetermined phase shift value.

20 Claims, 11 Drawing Sheets

PHASE CONTROL DEVICE AND METHOD FOR MULTI-RESONANCE SYSTEM

BACKGROUND

This disclosure relates generally to oscillation systems, and more particularly to improved systems for oscillating micro electro mechanical system (MEMS) scanning mirrors.

A scanning MEMS mirror is driven to perform rotational modulatory movement on one or two axes to steer or scan optical beams. To drive an MEMS mirror, an electromagnetic, electrostatic or piezoelectric actuator may be used, which can offer outstanding linearity between the input signal amplitude and mirror tilt angle. A typical electromagnetic actuator includes a coil which, when placed in a changing magnetic field, generates a Lorentz force that tilts the mirror. Various attempts have been made to operate an MEMS mirror at high tilt speeds with large tilt ranges, but significant areas remain for improved MEMS mirror operation.

SUMMARY

A resonance system is disclosed, which includes a first resonance device configured to receive a drive signal and generate an output signal; a second resonance device configured to receive a control signal and generate the drive signal based on the received control signal; and a controller configured to generate the control signal based on the output signal such that a phase difference between the control signal applied to the second resonance device and the output signal of the first resonance device corresponds to a predetermined phase shift value.

In another implementation, a controller for a resonance system is disclosed. The controller includes a phase-locked loop (PLL) configured to output a control signal; and a processor configured to control the PLL based on the control signal output from the PLL and an output signal received from a first resonance device. The first resonance device is driven by a drive signal generated by a second resonance device based on the control signal. The processor is configured to control the PLL to adjust a phase difference between the control signal and the output signal of the first resonance device to correspond to a predetermined phase shift value.

In another implementation, a method of controlling a resonance system is disclosed. The method includes receiving an output signal from a first resonance device, the output signal including oscillation information of the first resonance device; generating a control signal based on the received output signal; supplying the generated control signal to a second resonance device configured to generate a drive signal for driving the first resonance device based on the control signal; determining a phase difference between the control signal and the output signal of the first resonance device; and adjusting the phase difference to correspond to a predetermined phase shift value.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

Figure 1A:
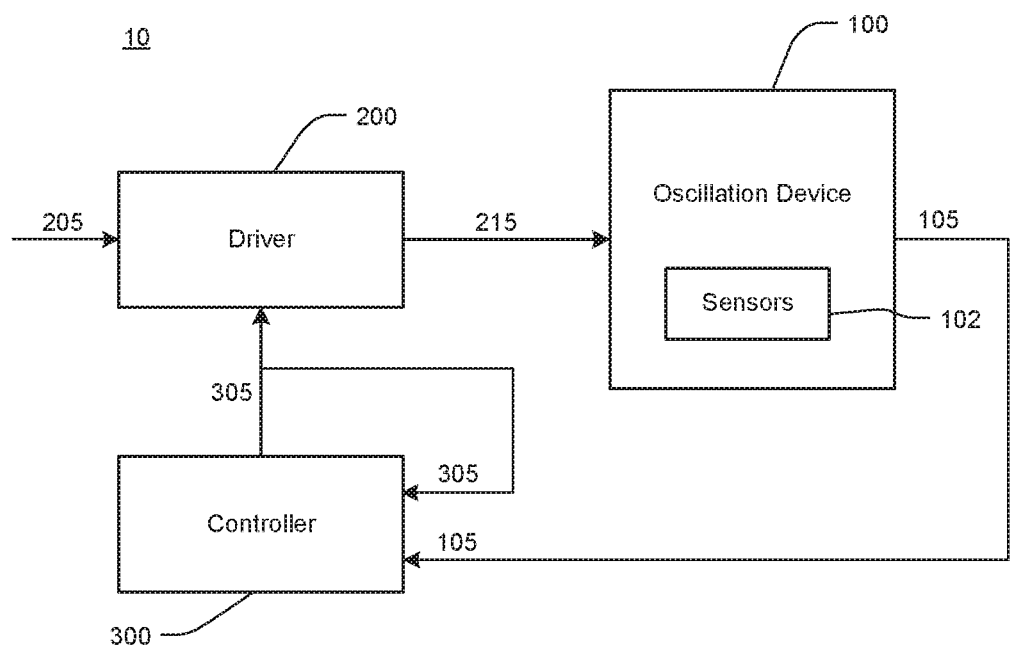
FIG. 1A shows an example of an oscillation system including an oscillator, a driver and a controller.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

This description is directed to a device and method for operating a multiple resonance system with an improved efficiency. For example, an oscillation system may be constructed with a plural number of resonance devices. The resonance devices may include an oscillator and a resonance driver that drives the oscillator. To maximize oscillator amplitude, the oscillator may be driven to operate at its resonant frequency. To improve the power delivery efficiency, the resonance driver may be operated at a frequency proximate to the resonant frequency of the driver. The resonance driver, however, tends to introduce an additional phase shift to the existing phase shift caused by the oscillation of the oscillator. Hence, without knowing the exact phase shift caused by the entire oscillation system, the resonance driver may drive the oscillator outside the resonance frequency, decreasing oscillation amplitude.

To solve this conflict between the oscillator amplitude and driver efficiency, in the description below, the phase shift caused by the entire oscillation system is predetermined. For example, the phase shift of the oscillation system may be determined via a simulation based on the phase shift caused by the oscillator and the additional phase shift caused by the resonance driver. The predetermined phase shift value may be stored in a data storage unit. Then, a phase difference between an input signal to the resonance driver and the oscillation output from the oscillator is compared to the predetermined phase shift value. If the phase difference does not match the predetermined phase shift value, the phase of the input signal to the resonance driver is adjusted such that the phase difference is adjusted to match the predetermined phase shift value. Once the phase difference matches the predetermined phase shift value, the phase of the input signal to the resonance driver is locked. By doing so, the resonance driver may operate very close to its resonant frequency, increasing energy efficiency and consuming less power, while the oscillator will operate at its own resonant frequency for maximum amplitude.

As known in the art, resonance refers to a phenomenon in which a vibrating system or external force drives another system to oscillate with greater amplitudes at specific frequencies. Resonance occurs when a system is able to store and transfer energy between two or more different energy types, such as, for example, kinetic energy and potential energy in a pendulum. Resonance occurs in all types of vibrations or waves in the form of mechanical resonance, acoustic resonance, electromagnetic resonance, nuclear magnetic resonance (NMR), electron spin resonance (ESR), resonance of quantum wave functions, and the like.

A resonant frequency refers to a frequency at which an oscillation system or device responds with a relative maximum amplitude. Even with a small periodic driving force, an oscillation system may produce a larger amplitude oscillation at the resonant frequency. Some systems have multiple distinct resonance frequencies. Damping refers to a decrease in the amplitude of an oscillation as a result of energy being drained from the system to overcome frictional or other resistive forces. In oscillation systems, damping typically occurs from cycle to cycle. When damping is small, the resonant frequency is approximately equal to the natural frequency of the system, which is a frequency of unforced vibrations.

Resonance occurs in an electric circuit at a particular resonant frequency when parts of the impedances or admittances of the circuit elements cancel each other out. In some circuits, electrical resonance occurs when the impedance between the input and output of a circuit is almost zero and the transfer function is close to unity. A resonance circuit can be designed to generate output voltages and currents that are higher than input voltages and currents, as is widely used in radio technologies.

FIG. 1A shows an exemplary oscillation system 10, which is one example of a multi-resonance system. The oscillation system 10 includes an oscillation device (first resonance device) 100, a driver (second resonance device) 200 and a controller 300. It is noted, however, that the multi-resonance system is not limited to two resonance devices and may be constructed with any plural number of resonance devices with various resonant frequencies.

The oscillation device 100 may oscillate when a drive signal 215 is applied thereto. The oscillation device 100 may oscillate with a greater amplitude when operating at its resonant frequency. The driver 200 may be constructed to receive the first input signal 205 and generate the drive signal 215 for the oscillation device 100. Similar to the oscillation device 100, the driver 200 may oscillate at its resonant frequency to produce the driver signal 215 having a greater amplitude. The resonant frequency of the driver 200 may be different from that of the oscillation device 100.

Electric current contains kinetic and potential energies, and these energies may be transferred from one place to another in a form of an electrical signal. Hence, the first input and drive signal 205, 215 may be referred to as input and drive energies, respectively. As such, the scope of the term "signal" in this description is not limited to the particular energies in electric current, and may be extended to include any energy type, for example, kinetic energy, potential energy, chemical energy, radiant energy, thermal energy, and/or the like.

The oscillation device 100 may generate an output signal 105. The output signal 105 may include oscillation information (e.g., oscillation frequency, phase, amplitude, etc.) of the oscillation device 100. For example, the oscillation device 100 may include one or more sensors 102 that detect the oscillation information of the oscillation device 100. As shown in FIG. 1A, the sensors 102 may be integrated within the oscillation device 100. Alternatively, the sensors 102 may be provided externally to the oscillation device 100.

In some implementations, some of the sensors 102 may be constructed to detect one or more environmental conditions, such as temperature, humidity, air/gas density, altitude, acceleration, gravitational force, electromagnetic force, orientation, velocity, etc. of the oscillation device 100. These sensors 102 may detect certain environmental conditions, such as damping conditions, that may change the oscillation characteristics of the oscillation device 100. The oscillation device 100 and/or sensors 102 may output the oscillation characteristics and/or environmental conditions as a part of the output signal 105.

The output signal 105 may be sent to the controller 300 as a feedback signal 105. The controller 300 may be constructed to monitor one or more oscillation characteristics (e.g., oscillation frequency, phase, amplitude, damping conditions, etc.) of the oscillation device 100 and control the driver 200. For example, the controller 300 may be connected to the oscillation device 100 to receive the feedback signal 105. Based on the feedback signal 105, the controller 300 may output a control signal 305, which is the second input signal to the driver 200, to control the driver 200. The controller 300 may also monitor one or more environmental conditions of the oscillation device 100, which may be included in the feedback signal 105. The control signal 305 may include instructions to adjust one or more characteristics (e.g., phase, frequency, amplitude, etc.) of the drive signal 215 to specific values. Hence, the controller 300 may control the driver 200 to generate the drive signal 215 having, for example, a specific frequency, phase and/or amplitude.

Figure 1B:
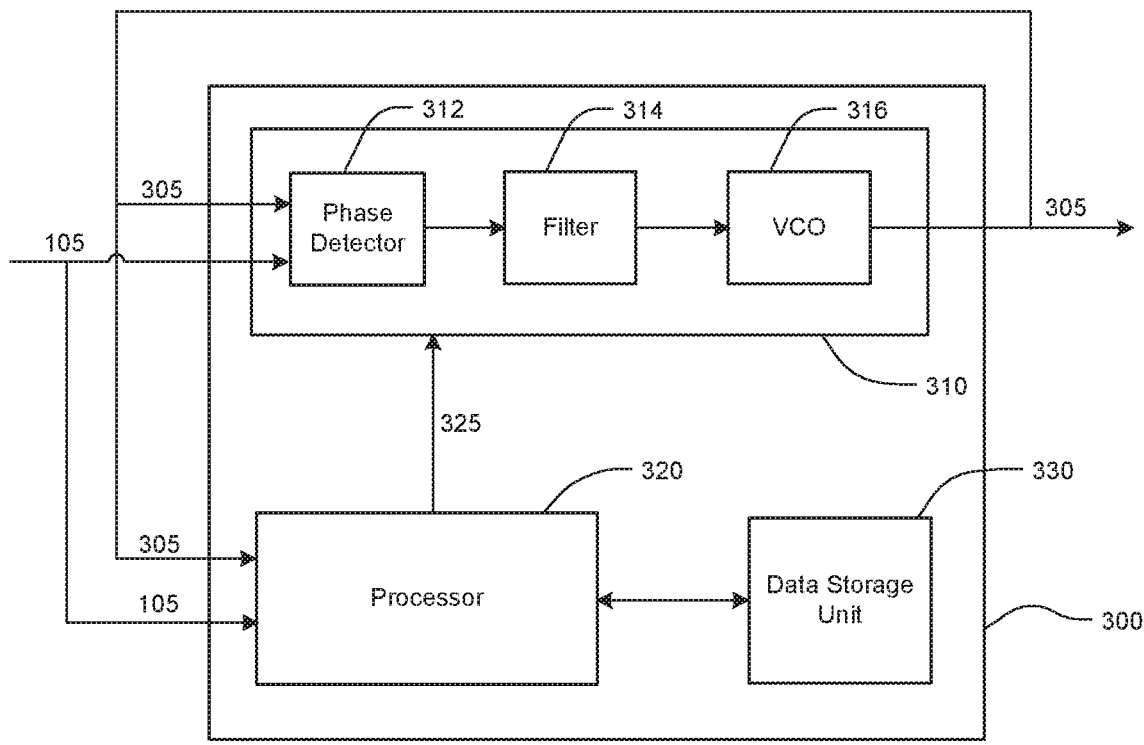
FIG. 1B shows an example of a controller of the oscillation system of FIG. 1.

FIG. 1B shows an exemplary controller 300 constructed and operating to output the control signal 305, which is the second input signal to the driver 200. The controller 300 may include, for example, a phase-locked loop (PLL) 310, a processor 320 and a data storage unit 330. The PLL 310 may include a phase detector 312, a filter 314, and a voltage-controlled oscillator (VCO) 316. The controller 300 may also include an amplitude controller (not shown) to maintain the oscillation device 100 at a stable amplitude.

As described above, the driver 200 may be a resonance device. The controller 300 may control the driver 200 to operate at its resonant frequency. As known in the art, when a linear driving device (e.g., a class A driver in audio amplification) is used to drive the oscillation device 100, such a linear driver does not cause any considerable phase shift while the phase shift caused by the oscillation device is always 90°. Hence, when a non-resonance driver is used, the drive signal may be locked to have a 90° phase difference from the oscillation of the oscillation device 100, and the oscillation device 100 will operate at its resonant frequency, maximizing oscillation amplitude. However, when a resonance device (e.g., driver 200) is used to drive another resonance device (e.g., oscillation device 100) as shown in FIG. 1A, further phase shift is caused by the resonance driver 200. Hence, the 90° phase shift lock may result in operating the oscillation device 100 outside the resonant frequency, decreasing the oscillation amplitude.

To solve this problem, the controller 300 is constructed to adjust and/or lock the phase difference between an input signal (e.g., control signal 305) to the driver 200 and the output signal of the oscillation device 100 to correspond to the phase shift value caused by both resonance devices 100, 200 operating at their respective resonance frequencies. As described below in detail, the total phase shift value of the system 10 when resonance devices 100, 200 are operating at their resonance frequencies may be predetermined and stored in the data storage unit 330. The controller 300 may then determine whether the phase difference between the output signal 105 of the oscillation device 100 and the control signal 305 corresponds to the predetermined phase shift value. The output signal 105 may include phase information of the oscillation device 100, as described above. In the PLL 310, the phase detector 312 may receive the output signal 105 and the control signal 305 to detect the phase difference therebetween. The filter 314 may clean up the output signal from the phase detector 312. Based on the phase difference detected by the phase detector 312, the VCO 316 may generate the control signal 305, which is provided to the driver 200. The control signal 305 is also fed back to phase detector 312, as shown in FIG. 1B.

The processor 320 may control the PLL 310. For example, as shown in FIG. 1B, the processor 320 may receive the output signal 105 and the control signal 305 to monitor the phase difference between the output signal 105 of the oscillating device 100 and the control signal 305. The processor 320 may compare the phase difference to the predetermined phase shift value. The predetermined phase shift value may be stored in the data storage unit 330. When the detected phase difference does not match the predetermined phase shift value, the processor 320 may output a PLL control signal 325 to adjust the phase of the control signal 305. For example, the VCO 315 may be implemented to carry out a direct feedback control of the driving frequency, which may in turn adjust the driving phase. Once the phase difference is adjusted to match the predetermined phase shift value, the processor 320 may control the PLL 310 to lock the phase of the control signal 305 such that the phase difference between the control signal 305 and the oscillation phase of the oscillation device 100 is maintained at the predetermined phase shift value. Additionally, the processor 320 may control the PLL 310 to adjust the frequency, phase and/or amplitude of the drive signal 215 such that when damping occurs, the drive signal 215 may be adjusted for the specific damping condition.

The controller 300 may also be constructed to be responsive when one or more specific environment conditions occur. The oscillation system 10 may be tested under one or more environment conditions to monitor how the oscillation characteristics change. For example, the oscillation system 10 may be operated in a cold or hot climate to test how temperature influences the oscillation frequency and/or phase of the oscillation device 100. It has been observed that a resonant frequency may be moved by a temperature change while phase shifts are less susceptible to the environmental changes. If there is any phase shift of the target oscillation phase, the controller 300 may output the control signal 305 to try different frequencies or phases for the drive signal 215, and monitor how the oscillation phase of the oscillation device 100 changes. Based on this experiment, the controller 300 may obtain specific frequencies, phase and/or amplitude values for the drive signal 215 that are optimized to operate the oscillation device 100 at the maximum amplitude when a specific environment condition occurs.

The oscillation system 10 may be tested under different environments to obtain optimized drive signal characteristics that may operate the oscillation device 100 at the maximum amplitude under certain environmental conditions. The control signal values optimized for various environmental conditions may be collected and analyzed to create a database, index or lookup table, which may be stored in, for example, the data storage unit 330 shown in FIG. 1B. The data storage unit 330 may be included in the controller 300 or provided externally to the controller 300. When an environmental condition is detected, the processor 320 may refer to the database, index or lookup table in the data storage unit 330 for the optimized control signal values for the specific environmental condition, and then adjust the control signal 305 to generate the drive signal 215 having the optimized values. Hence, the controller 300 may be able to control the oscillation device 100 to operate at the maximum amplitude in various environmental conditions.

In some implementations, the oscillation system 10 may be, but not be limited to, a micro electromechanical system (MEMS)-based micro display device. Due to its small size, the MEMS-based micro display device may be integrated in a portable device, such as, a mobile phone, a tablet, a laptop, a mobile projector, etc. A typical DC voltage provided by a portable device battery (e.g., a Li-ion battery) is less than 4.5 V. A MEMS scanner typically includes a MEMS mirror that requires a substantial number of real power components to overcome friction. The driving voltage for a MEMS scanner is in the tens of voltage range. The MEMS mirror typically has a resonant frequency on the order of tens of kilohertz (kHz). Hence, up to a 10 VA imaginary power component may be needed to agitate an actuator for the MEMS mirror. The frequency component of the driving voltage is also required to be at the resonant frequency so as to properly operate the MEMS mirror.

Figure 2:
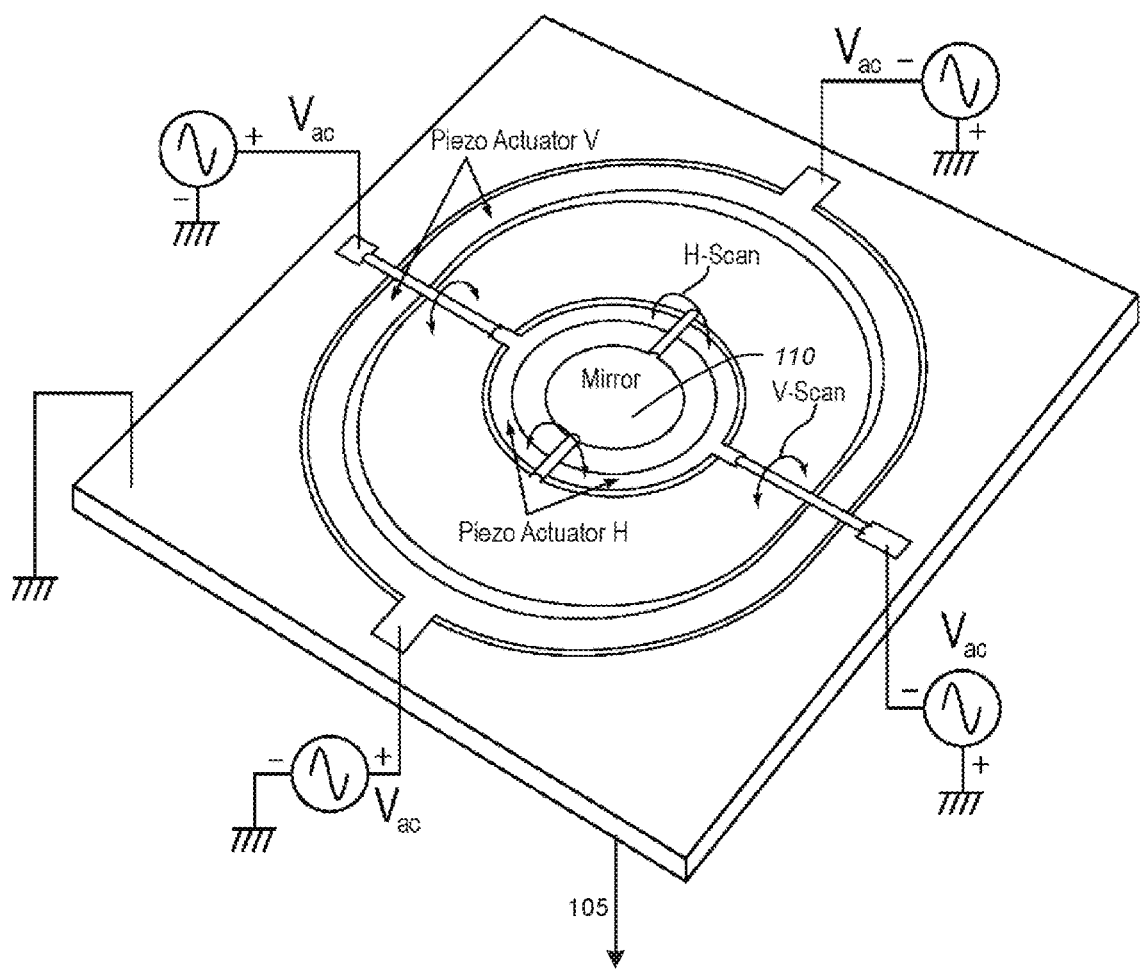
FIG. 2 shows an exemplary micro electro mechanical system (MEMS) scanner usable as the oscillation system of FIG. 1A.

FIG. 2 shows an example MMES scanner, which could be used as oscillation device 100. The MEMS scanner 100 may be implemented in a battery-powered portable device, such as, for example, a mobile phone, a tablet, a laptop, a portable projector, etc. The MEMS scanner 100 includes a reflective mirror 110 at its center, which is supported by two mutually orthogonally pivoting axes. The vertical scan and the horizontal scan are controlled via respective piezoelectric actuators. By applying oscillating electrical voltages to the respective piezoelectric actuators, the mirror 110 is driven to oscillate, causing appropriate scanning to occur on a display. The oscillation may be most efficiently obtained and maintained if occurring at a mechanical resonant frequency of the mirror 110. The voltages required to actuate the MEMS mirror 110 are quite high, often orders of magnitude higher than the maximum DC voltage that can be provided by a battery of a portable device. Hence, the driver for the MEMS scanner 100 is required to be energy efficient and consume less power.

Figure 3:
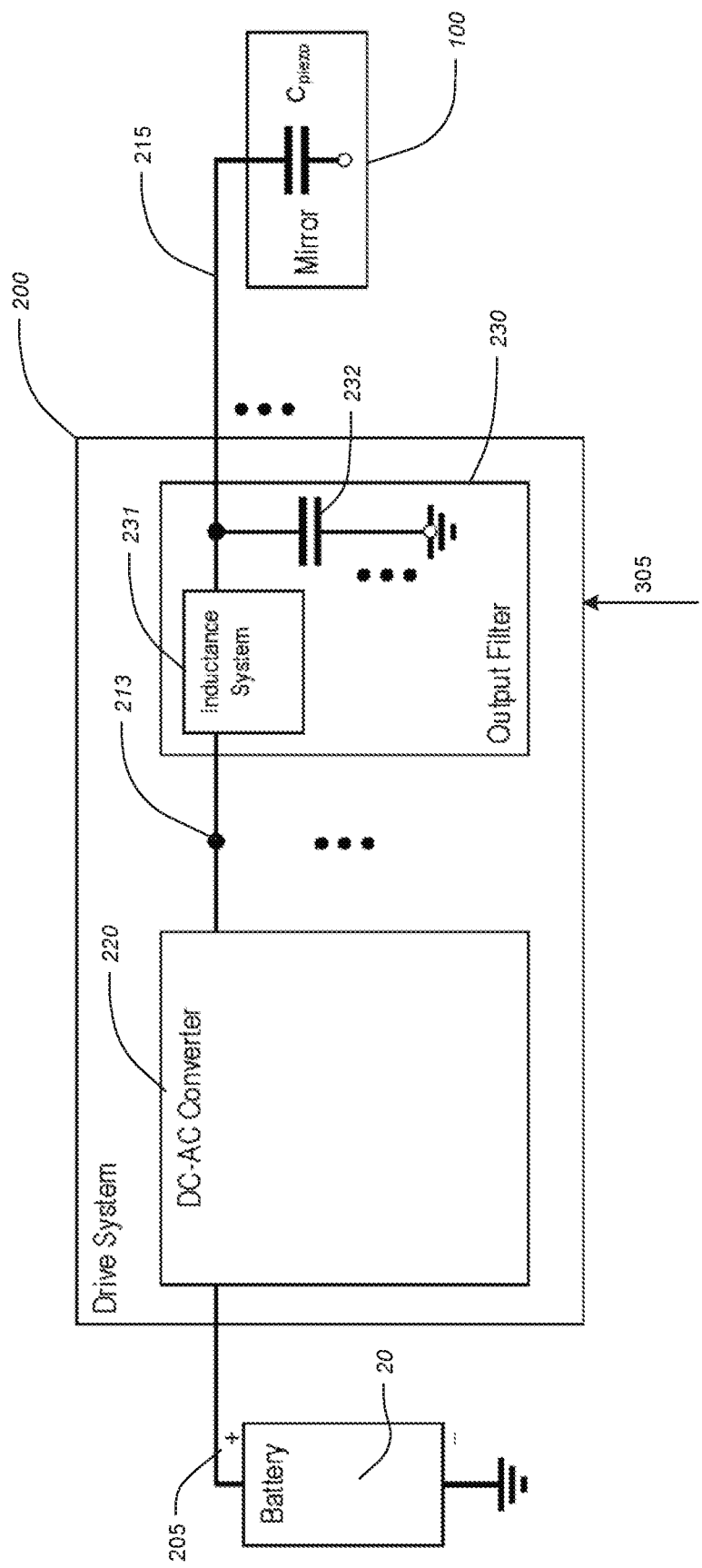
FIG. 3 shows an exemplary drive system usable as the driver illustrated in FIG. 1A.

FIG. 3 shows an exemplary drive system, which may be used as the driver 200 configured to drive the MEMS scanner 100 of FIG. 2. The driver 200 may be constructed and operated as described in U.S. patent application Ser. No.

15/793,819, titled "PIEZOELECTRONIC MIRROR SYSTEM," filed on Oct. 25, 2017, which is incorporated herein by reference in its entirety. As shown in FIG. 3, the driver 200 may be connected to a battery 20 to receive DC power as the input signal 205 thereto. Based on the input signal 205, the driver 200 may generate and output a high-voltage AC signal as the drive signal 215 for the MEMS scanner 100. The drive signal 215 may be a high voltage and high-quality output AC signal having a finely controlled frequency. For example, the drive signal 215 may operate at its resonant frequency to transfer more energy to the MEMS scanner 100.

As shown in FIG. 3, the driver 200 may include a DC-AC converter 220 and an output filter 230. The converter 220 may convert the DC input signal 205 provided by the battery 20 to AC power. The output filter 230 may receive the AC voltage from the converter 220. The output filter 230 may include an inductance system 231, which may be coupled in series between intermediate nodes 213 and an output of the driver 200. The output filter 230 may implement the inductance system 231 together with a capacitance $C_{piezo}$ of the MEMS scanner 100 to amplify AC voltage provided by the converter 220 at a resonant frequency of the MEMS scanner 100, and to provide the AC voltage for driving the MEMS scanner 100. The peak value of the amplified voltage at a resonant frequency of the MEMS scanner 100 may be at least ten times that of the DC voltage provided by the battery 201. The output filter 230 may include one or more tuning capacitors 232 to allow some deviation in the actual capacitance $C_{piezo}$ of the MEMS mirror 110 (shown in FIG. 2) that often occurs during fabrication of the MEMS scanner 100. The drive system 200 may, therefore, efficiently drive the MEMS scanner 100 while consuming less energy.

Figure 4:
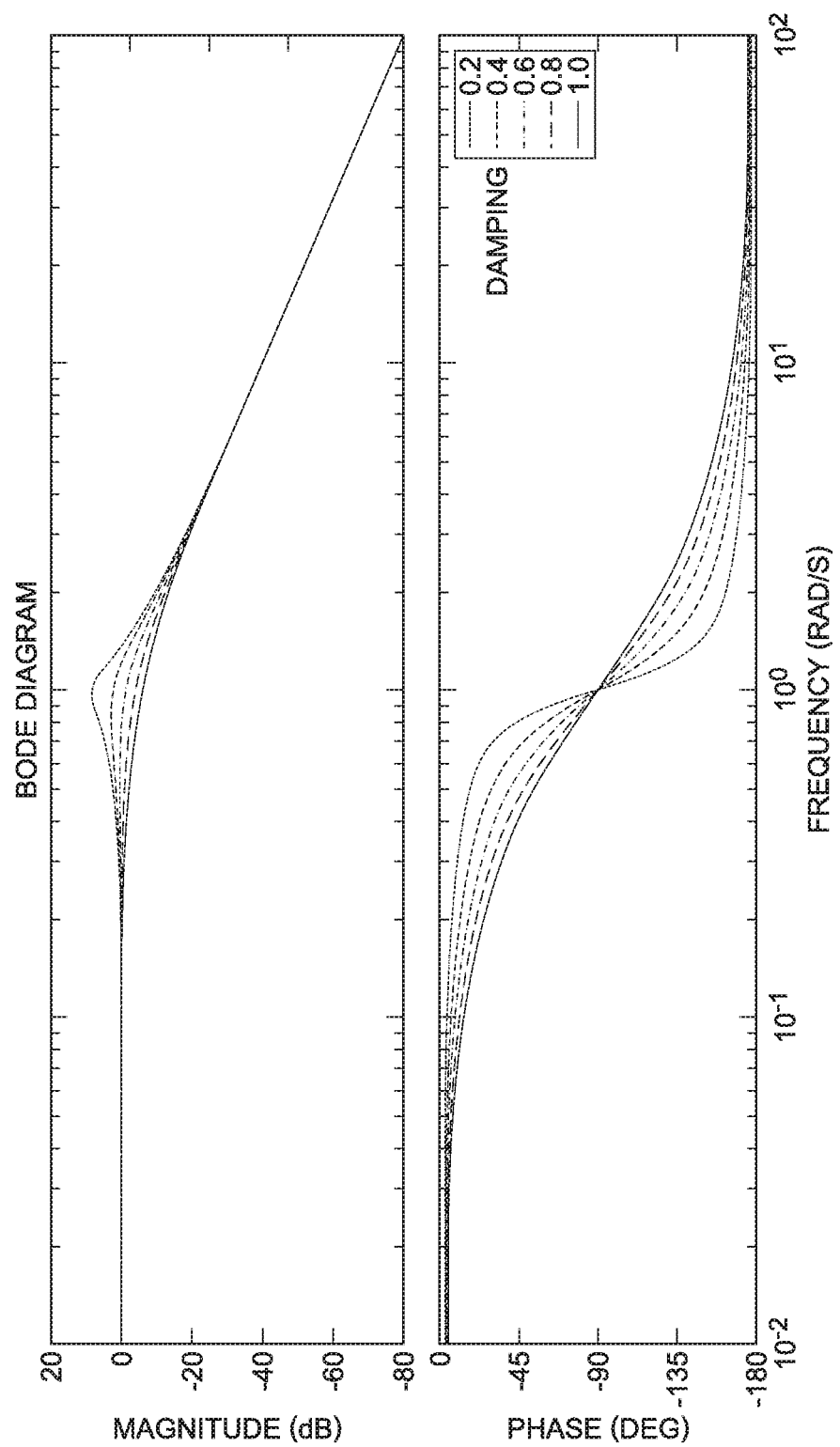
FIG. 4 is a graph showing exemplary frequency responses of the oscillator of the system shown in FIG. 1A, which is driven by an exemplary linear driver at different damping ratios.

FIG. 4 shows exemplary frequency responses of the oscillation device 100 driven by a non-resonance driver, for example, a class D linear driver (not shown), at different damping ratios (e.g., 0.2, 0.4, 0.6, 0.8 and 1.0). As shown in FIG. 4, the oscillation amplitude of the oscillation device 100 may change depending on the damping ratio, but the phase shift at the oscillation resonance always converges to 90° regardless of the damping ratio. Hence, a non-resonance driver may be designed to generate a drive signal that is locked to the 90° phase difference. However, in a non-resonance driver, a significant energy loss occurs when the input energy is transformed to the drive signal. Hence, a non-resonance driver requires and consumes considerable energy to generate the drive signal.

To improve the energy delivery efficiency, a resonance driver, for example, the drive system 200 shown in FIG. 3, may be used to generate the drive signal 215. Such a resonance device, however, may introduce an additional phase shift in the existing 90° phase shift occurring at the oscillating device 100. Different driver constructions may introduce different degrees of phase shift. When the additional phase shift occurs, the drive signal 215 that locks the phase shift at 90° will cause oscillation by the oscillator 100 to be at a non-resonant frequency and with a reduced amplitude. Hence, if the drive signal 215 is generated without considering this additional phase shift, the oscillation device 100 will not operate at its resonant frequency and hence not at its maximum amplitude.

Figure 5:
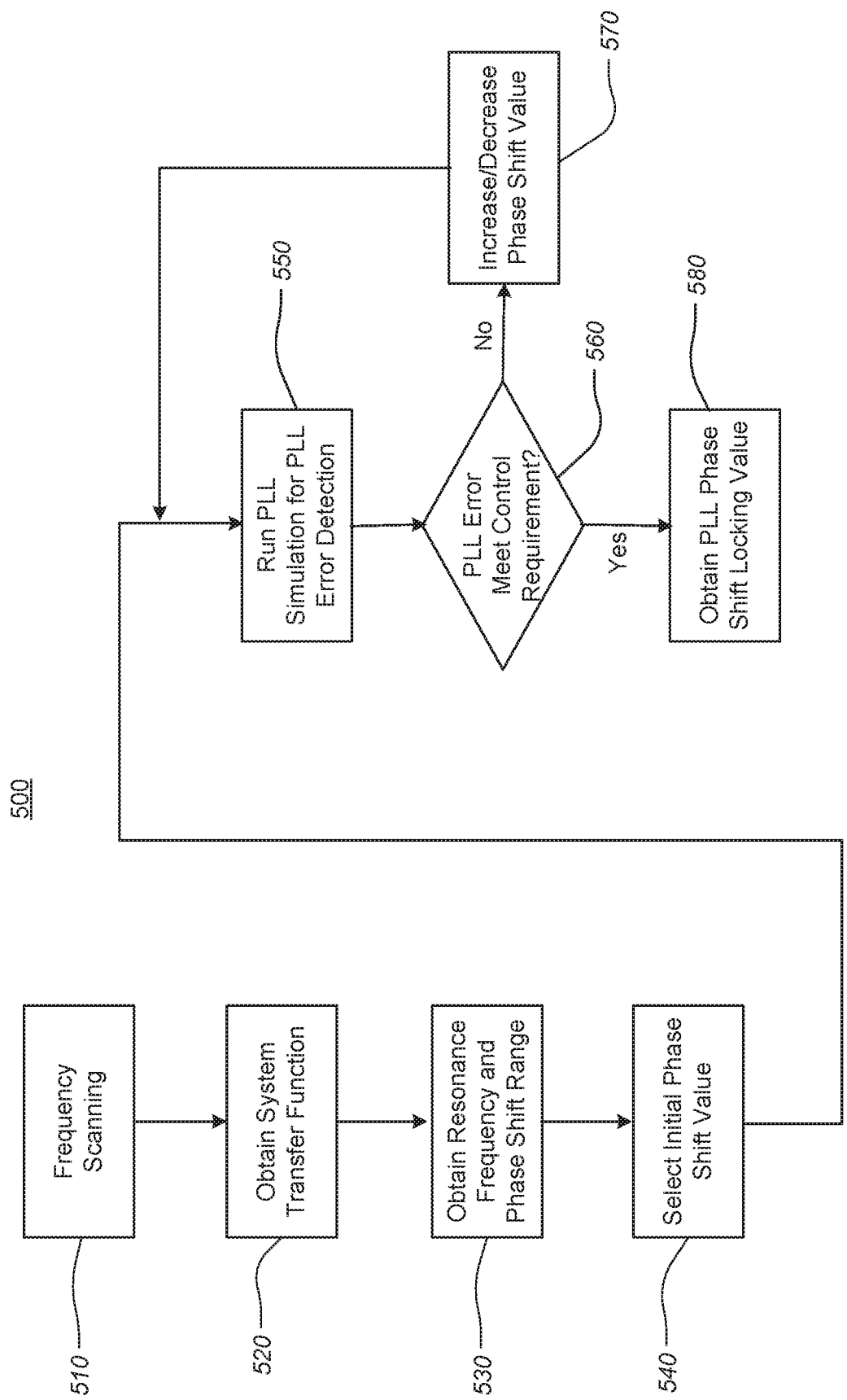
FIG. 5 is a block diagram showing an exemplary process for determining the phase shift value in the oscillation system of FIG. 1.
Figure 6:
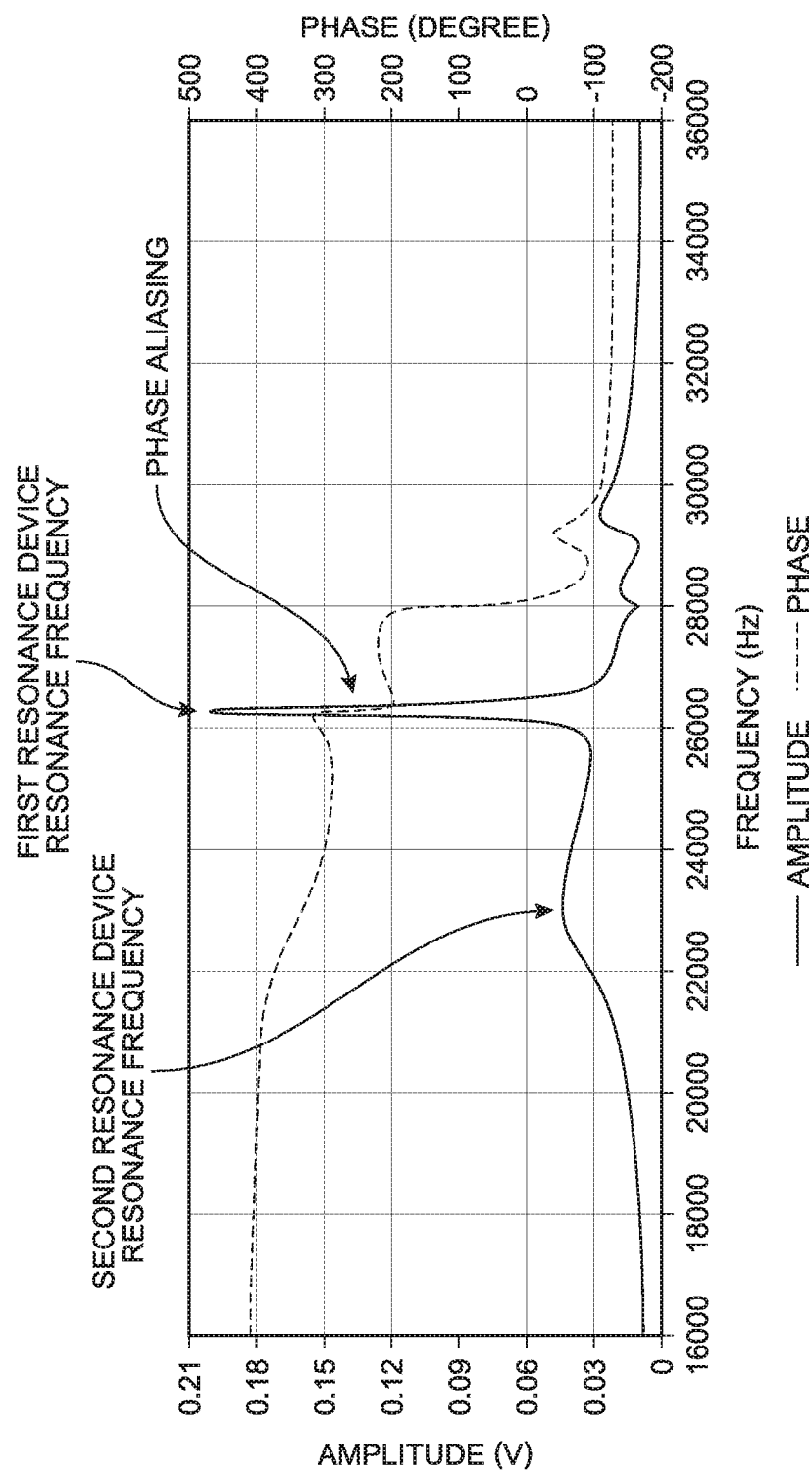
FIG. 6 is a graph showing exemplary frequency responses of the oscillator and driver of the oscillation system of FIG. 1A.

FIG. 5 is a flow chart showing an exemplary process 500 for determining the additional phase shift in an oscillation system, such as, for example, the oscillation system 10 shown in FIG. 1A. First, frequency scanning may be performed (Step 510) to obtain frequency responses of the oscillation device 100. For example, various driving signals having different frequencies may be applied to the oscillation device 100 to monitor how the oscillation device 100 responds to the different input frequencies. FIG. 6 is a graph showing exemplary frequency responses of the oscillation device 100 and the driver 200. As shown in the graph, the resonant frequency of the oscillation device 100 in this example is 26,265 Hz. The phase shift of the resonant frequency of the oscillation device 100 is unknown at this time because the total phase shift that occurs in the double resonance device 100 is a superposition of the phase shift caused by the resonance driver 200 and the 90° phase shift caused by the oscillation device 100.

Then, a system transfer function of the oscillation device 100 may be obtained (Step 520). For example, a curve fitting/system identification tool may be used to obtain a discrete transfer function of the oscillation device 100. The system transfer function may have four poles. The discrete transfer function of the oscillation system 10 may be expressed as follows:

$$DTF = \frac{-0.002298 + 0.009358z^{-1} - 0.01429z^{-2} - 0.0097z^{-3} - 0.002469z^{-4}}{1 - 3.989z^{-1} + 5.974z^{-2} - 3.979z^{-3} + 0.9949z^{-4}}$$

wherein "z" is a complex frequency domain representation value converted from a discrete-time signal of the oscillation device 100.

Figure 7A:
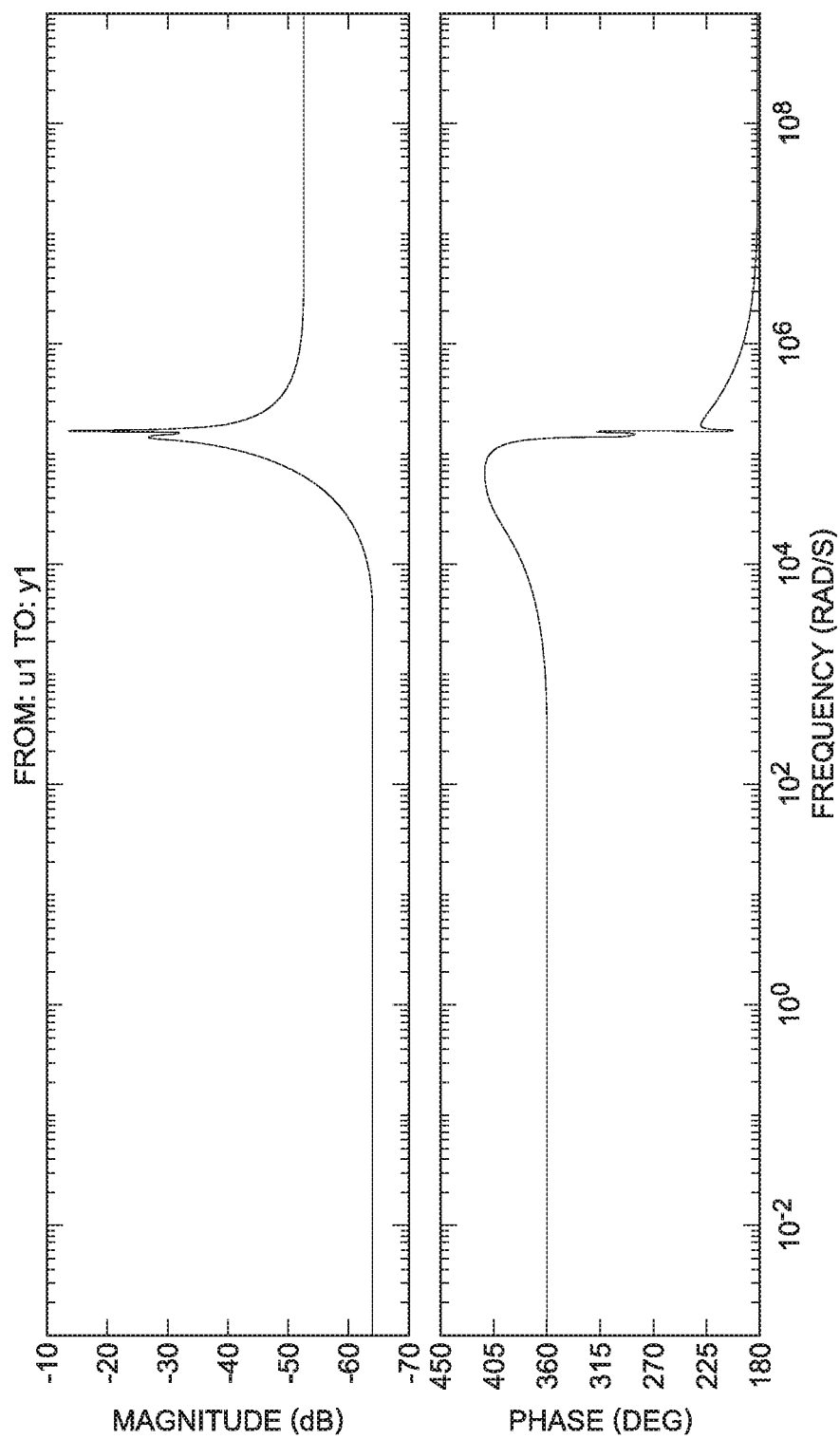
FIG. 7A presents graphs showing an exemplary Bode plot of the discrete transfer function, as implemented.
Figure 7B:
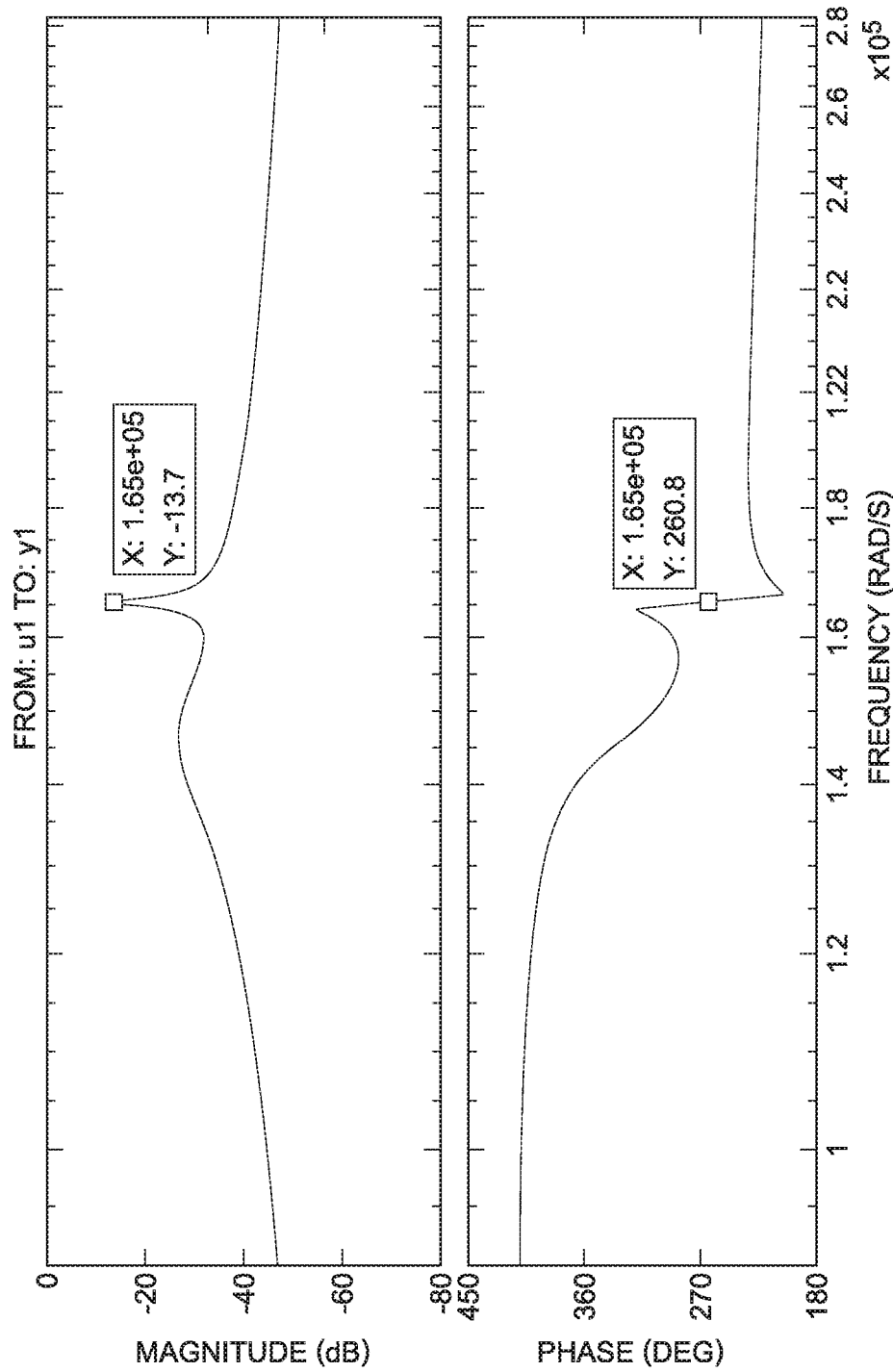
FIG. 7B shows a zoomed-up version of the Bode plot of FIG. 7A.

Based upon the system transfer function from Step 520, a resonant frequency and phase shift range of the oscillation device 100 may be determined (Step 530). For example, the discrete transfer function may be processed to obtain a Bode plot, which is typically a combination of a Bode magnitude plot, expressing the magnitude of the frequency response, and a Bode phase plot, expressing the phase shift. FIG. 7A is an exemplary Bode plot of the discrete transfer function. A zoomed-up version of the Bode plot of FIG. 7A is shown in FIG. 7B. From the Bode plot, the phase shift range may be determined. For example, the zoomed-up phase Bode plot shown in FIG. 7B shows that the phase of the oscillation device 100 shifts between about 360° and about 260.8° near the resonant frequency, which indicates that the phase shift is in a range between 80° and 100°. This phase shift range, however, may not be precise enough to meet control requirements. As described above, in order to ensure that the oscillation device 100 operates at its resonant frequency under various damping conditions, the phase shift of the drive signal 215 may need to be locked by, for example, the PLL 310 (shown in FIG. 1B), at a precise locking angle that equals a superposition of the 90° phase shift caused by the oscillation device 100 and the additional phase shift caused by the driver 200.

Then, an initial phase shift value may be selected from the phase shift range for simulation (Step 540). The initial phase shift may be a sum of the 90° phase shift caused by the oscillation device 100 (referred to as "existing phase shift value" hereinafter) and the additional phase shift caused by the driver 200 ("additional phase shift value" hereinafter). In some implementations, a phase shift value that minimizes the PLL error for control accuracy may be selected as the initial phase shift value. Using the initial phase shift value and the resonant frequency of the oscillation device 100, a PLL simulation may be performed (Step 550). A multidomain dynamical system simulator, for example, Simulink®, may be used for the simulation.

Figure 8:
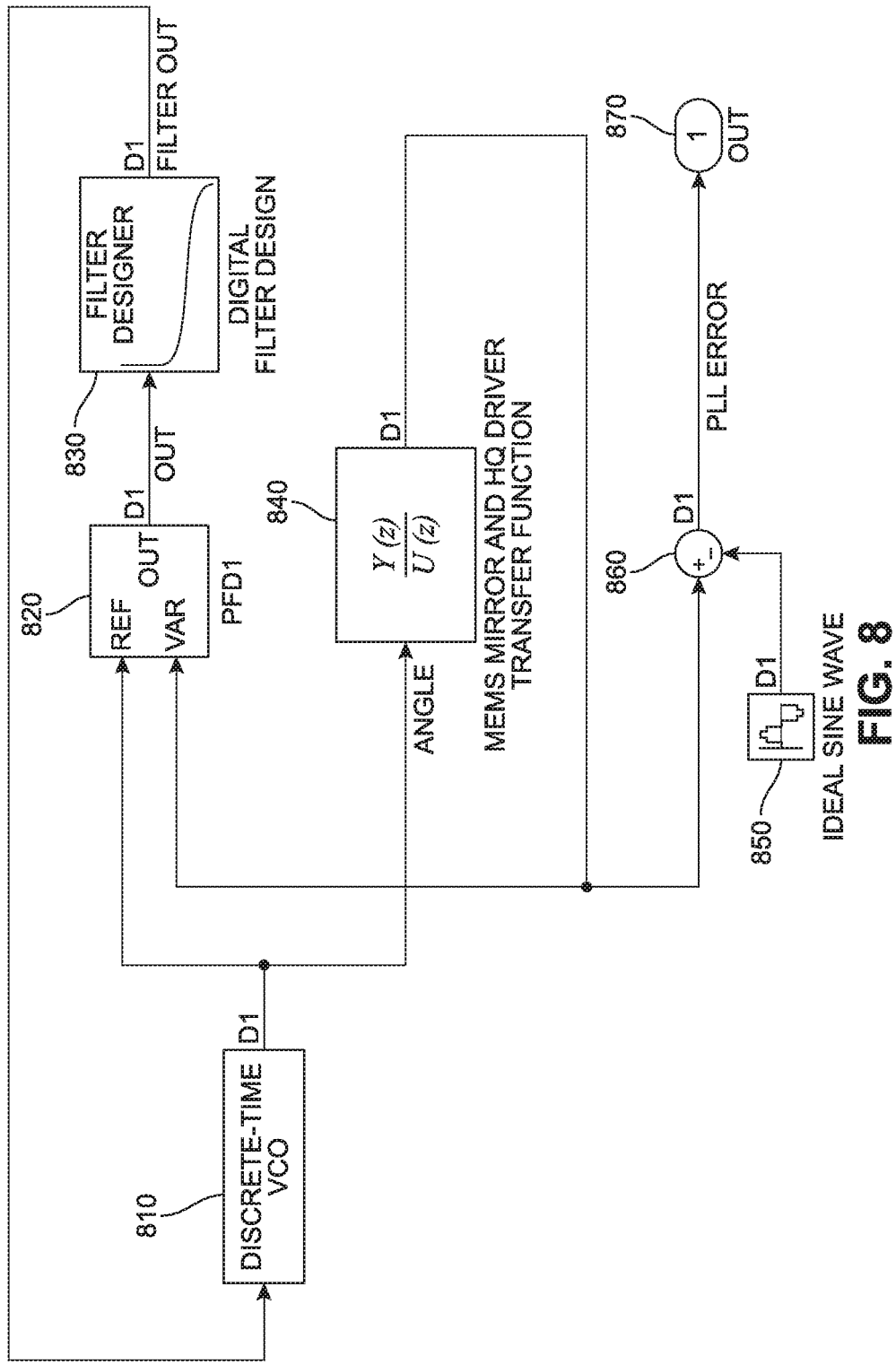
FIG. 8 illustrates an exemplary simulation model for the oscillation system of FIG. 1.

FIG. 8 shows an exemplary PLL simulation model 800 for the oscillation system 10 of FIG. 1. The PLL simulation model 800 may be designed to include a plurality of blocks that correspond to the devices and components shown in FIGS. 1A, 1B. For example, the PLL simulation model 800 includes a "Discrete-Time VCO" block 810 that models the VCO 316, a "PDF1" block 820 that models the phase detector 312, a "Digital Filter Design" block 830 that models the filter 314, a "MEMS mirror and HQ Driver Transfer Function" block 840 that models a combination of the MEMS scanner 100 (shown in FIG. 2) and the driver 200 (shown in FIG. 3), an "Ideal Sine Wave" generator block 850, a subtractor 860, and an output terminal 870 that outputs an PLL error. These model blocks are interconnected based on the interconnections between the devices and components shown in FIGS. 1A and 1B. Using the PLL simulation model 800, dynamic behaviors of the oscillation system 100 may be simulated.

Figure 9:
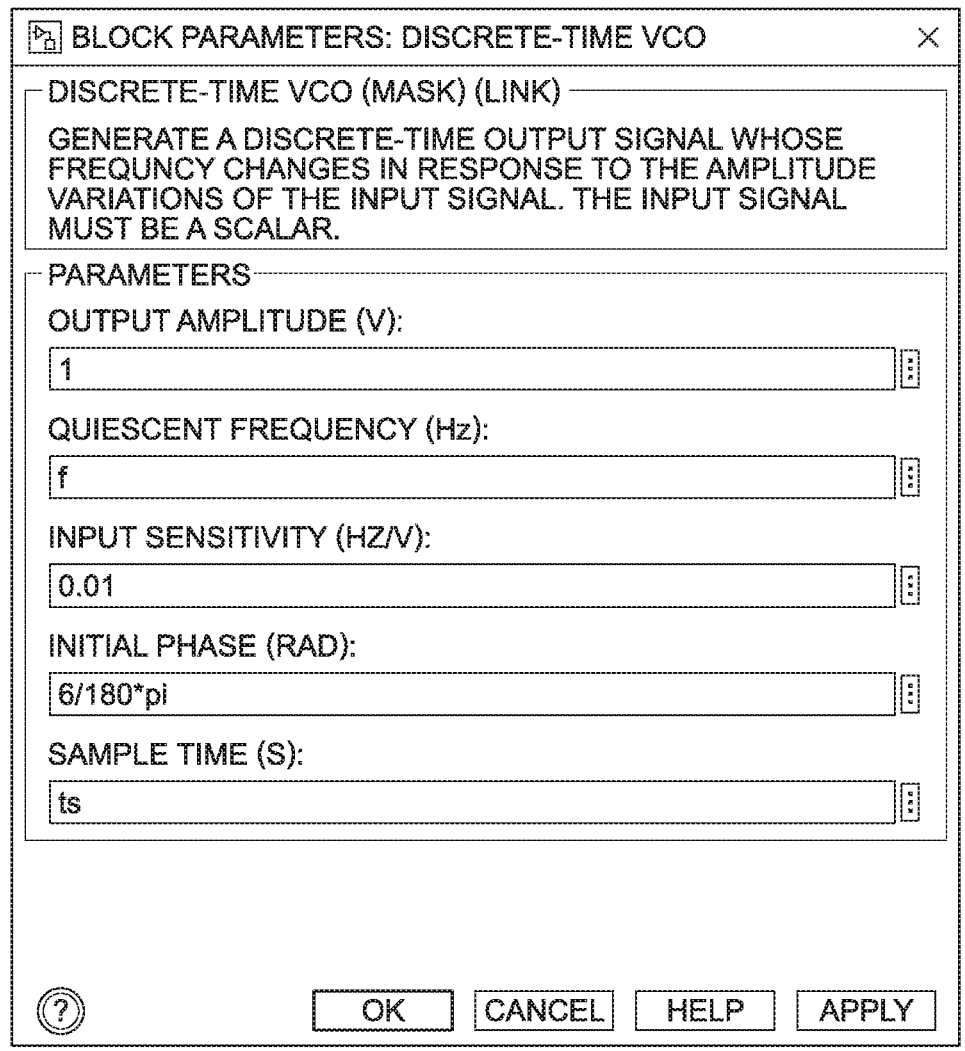
FIG. 9 shows an exemplary user interface for entering discrete-time block parameters in a phase-locked loop (PLL) of the simulation model shown in FIG. 8.

FIG. 9 shows an exemplary user interface for entering discrete-time VCO block parameters for the simulation model shown in FIG. 8. Using the user interface shown in FIG. 9, various parameters may be selected for simulation, including, for example, output amplitude (i.e., the output cosine wave amplitude), quiescent frequency (i.e., the resonant frequency of the oscillation device 100), input sensitivity (i.e., a control sensitivity that may also determine how far the real resonance is allowed to derivate from the quiescent frequency), sample time (i.e., the time between two sampling points), and an initial phase. The initial phase may be the additional phase shift value that is selected to minimize the PLL error for control accuracy (from Step 530). FIG. 9 shows an initial phase of 6° selected for simulation, but other values may be selected. If the PLL simulation results based on the initial phase (from Step 550) indicates that the output PLL error does not meet the control requirement (NO at Step 560), the initial phase may be increased or decreased (at Step 570) and the process 500 may loop back to perform a new PLL simulation with the increased or decreased phase (at Step 550). The processes at Steps 550, 560, 570 may be automatically executed using, for example, MATLAB® code, or the like, to try different phase values until the phase value that meets the control requirement is found.

If the phase shift value of the initial phase (from Step 540) or the increased or decreased phase shift value (from Step 570) meets the control requirement (YES at Step 560), the phase shift value may be determined to be the additional phase shift value. The additional phase shift value (e.g., 6°) may then be added to the 90° existing phase shift value to obtain a PLL phase shift locking value (e.g., 96°), which may be stored in, for example, the data storage unit 330 shown in FIG. 1B, as the predetermined phase shift value for the oscillation device 100. The predetermined phase shift value may be used to adjust the phase of the control signal 305 such that the phase difference between the control signal 305 and the oscillation of the oscillation device 100 corresponds to the predetermined phase shift value.

Figure 10:
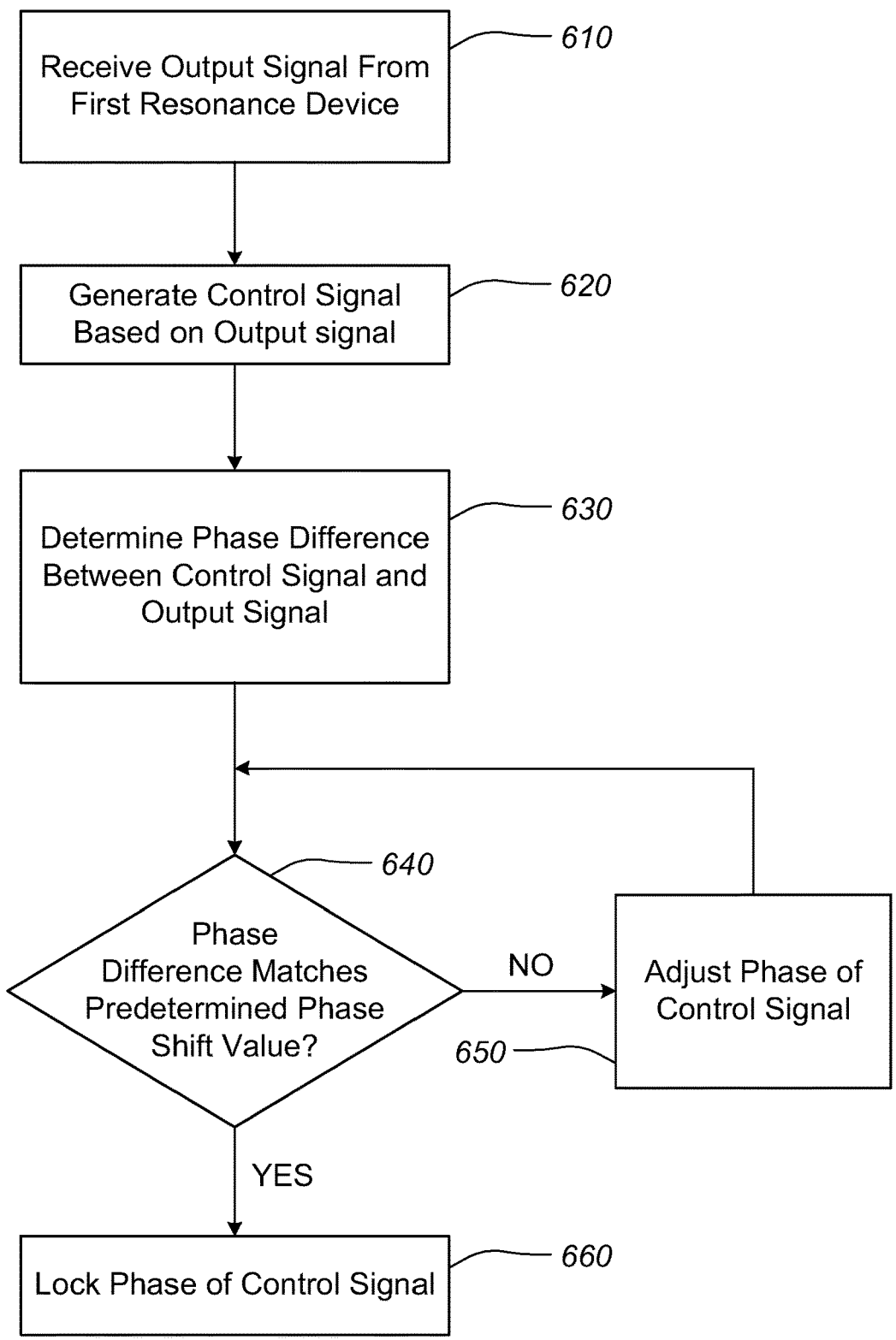
FIG. 10 is a block diagram showing an exemplary process for operating the oscillation system of FIG. 1A.

FIG. 10 is a flow chart showing an exemplary process 600 for operating the oscillation system 10 shown in FIG. 1A. Upon starting, the controller 300 may receive the output signal 105 from the first resonance device 100 (Step 610). As described above, the output signal 105 may include a feedback signal that includes the oscillation information (e.g., frequency, phase, amplitude, etc.) of the first resonance device 100. Based on the output signal 105, the controller 300 may generate and output the control signal 305 (Step 620). The control signal 305 is input to the second resonance device 200, and the second resonance device 200 may generate the drive signal 215 based on the control signal 305, which is input to the first resonance device 100. The controller 300 may then determine a phase difference between the control signal 305 and the output signal 105 of the first resonance device 100 (Step 630). For this step, the control signal 305 output from the PLL 310 may be provided to the controller 300. The phase information in the output signal 105 may be used to determine the phase of the first resonance device 100. The phase difference between the control signal 305 and the output signal 105 may be compared to the predetermined phase shift value of the first resonance device 100 and the second resonance device 200 (Step 640). As described above, the predetermined phase shift value may be based on the phase shift caused by the first resonance device 100 and the additional phase shift caused by the second resonance device 200. The predetermined phase shift value may be stored in the data storage unit 330.

When the phase difference matches the predetermined phase shift value (YES at Step 640), the controller 300 may lock the phase of the control signal 305 (Step 660) to maintain the current phase difference, and the first resonance device 100 may operate at its resonant frequency, maximizing the oscillation amplitude. The second resonance device 200 may be also operated at a frequency proximate to its resonant frequency, increasing power delivery efficiency. When the phase difference does not match the predetermined phase shift value (NO at Step 640), the controller 300 may adjust the phase of the control signal 305 (Step 650) such that the phase difference is adjusted to match the predetermined phase shift value, and the adjusted phase difference may be compared to the predetermined value until the phase difference matches the predetermined phase shift value (YES at Step 640). When the output signal 105 indicates that there is a change in the phase information, the controller 300 may start over the process 600 to detect whether the phase difference still matches the predetermined phase shift difference (Step 640) and make a necessary adjustment to the phase of the control signal 305 (Step 650) if the phase difference does not match the predetermined phase shift value (NO at Step 640) until the phase difference is accurately adjusted to match the predetermined phase shift value (YES at Step 640). Upon completing the phase adjustment, the phase of the control signal 305 may be locked (Step 660). The phase locking may be carried out by a dynamic locking scheme such that the VCO 316 may continue to adjust the frequency of the control signal 305 to lock the phase difference to the predetermined phase shift value.

As such, according to the description, the additional phase shift caused by the resonance driver 200 is determined based on simulation, and the predetermined phase shift value of the entire resonance system 10 is determined based on the phase shift caused by the oscillation device 100 and the additional phase shift caused by the resonance driver 200. The predetermined phase shift value may then be compared to a phase difference between the control signal 305 and the oscillation of the oscillation device 100. By adjusting the control signal 305 to have the predetermined phase difference from the first resonance device 100, the oscillation device 100 may operate at the resonant frequency and at its maximum amplitude.

Also, the driver 200 may operate near its resonant frequency, thereby increasing the energy efficiency and consuming less power to generate the drive signal 215.

As described above, the device and method in this description may be applied to a resonance system including any plurality of resonance devices. For example, the driver 200 may include two or more resonance drivers that are connected in series and/or parallel. Similarly, the oscillation device 100 may include two or more resonance devices connected in series and/or parallel. The controller 300 may then be constructed to provide one or more control signals 305 to control one or more resonance devices of the driver 200. The controller 300 may also be constructed to receive one or more output feedback signals 105 from one or more resonance devices of the oscillation 100. The phase shift value of the entire oscillation system may be predetermined based on the phase shift caused by each resonance device. The controller 300 may then adjust the control signal 305 such that the input and output signal phase difference of the resonance devices matches the predetermined phase shift value.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A resonance system comprising:
    a first resonance device configured to receive a drive signal and generate an output signal;
    a second resonance device configured to receive a control signal and generate the drive signal based on the received control signal; and
    a controller configured to generate the control signal based on the output signal such that a phase difference between the control signal applied to the second resonance device and the output signal of the first resonance device corresponds to a predetermined phase shift value.

2. The resonance system of claim 1, wherein the predetermined phase shift value is based on a first phase shift caused by the first resonance device and a second phase shift caused by the second resonance device.

3. The resonance system of claim 1, wherein the predetermined phase shift value is not 90°.

4. The resonance system of claim 1, wherein the first resonance device is a micro electro mechanical system (MEMS) scanner comprising a MEMS mirror configured to oscillated based on the drive signal.

5. The resonance system of claim 1, wherein the first resonance device comprises a sensor configured to detect an oscillation of the first resonance device and generate the output signal including phase information associated with the first resonance device.

6. The resonance system of claim 5, wherein the controller comprises:
a phase-locked loop (PLL) configured to output the control signal; and
a processor configured to generate a PLL control signal, wherein the PLL control signal is configured to adjust a phase of the control signal such that the phase difference between the control signal and the output signal of the first resonance device corresponds to the predetermined phase shift value.

7. The resonance system of claim 6, wherein the processor is configured to control the PLL using the PLL control signal to lock the phase of the control signal when the phase difference corresponds to the predetermined phase shift value.

8. The resonance system of claim 6, wherein the PLL comprises:
a voltage-controlled oscillator (VCO) configured to output the control signal;
a phase detector configured to receive the control signal output from the VCO and the output signal; and
a filter coupled between the phase detector and the VCO,
wherein the processor is configured to receive the control signal output from the PLL and the output signal to detect the phase difference.

9. The resonance system of claim 8, further comprising a data storage unit configured to store the predetermined phase shift value, wherein the processor is configured to compare the phase difference to the predetermined phase shift value and output the PLL control signal based on a result of the comparison between the phase difference and the predetermine phase shift value.

10. A controller for a resonance system, the controller comprising:
a phase-locked loop (PLL) configured to output a control signal; and
a processor configured to control the PLL based on the control signal output from the PLL and an output signal received from a first resonance device,
wherein the first resonance device is driven by a drive signal generated by a second resonance device based on the control signal,
wherein the processor is configured to control the PLL to adjust a phase difference between the control signal and the output signal of the first resonance device to correspond to a predetermined phase shift value.

11. The controller of claim 10, wherein the predetermined phase shift value is based on a first phase shift caused by the first resonance device and a second phase shift caused by the second resonance device.

12. The controller of claim 10, wherein the processor controls the PLL to adjust a phase of the control signal such that the phase difference corresponds to the predetermined phase shift value.

13. The controller of claim 12, wherein the processor controls the PLL to lock the phase of the control signal when the phase difference corresponds to the predetermined phase shift value.

14. The controller of claim 10, wherein the PLL comprises:
a voltage-controlled oscillator (VCO) configured to output the control signal;
a phase detector configured to receive the control signal output from the VCO and the output signal; and
a filter coupled between the phase detector and the VCO.

15. The controller of claim 10, further comprising a data storage unit configured to store the predetermined phase shift value, wherein the processor compares the phase difference to the predetermined phase shift value.

16. The controller of claim 15, wherein:
the processor is configured to control the PLL by generating a PLL control signal, and
the PLL control signal is generated based on a result of a comparison between the phase different and the predetermined phase shift value.

17. A method of controlling a resonance system, the method comprising:
receiving an output signal from a first resonance device, the output signal including oscillation information of the first resonance device;
generating a control signal based on the received output signal;
supplying the generated control signal to a second resonance device configured to generate a drive signal for driving the first resonance device based on the control signal;
determining a phase difference between the control signal and the output signal of the first resonance device; and
adjusting the phase difference to correspond to a predetermined phase shift.

18. The method of claim 17, wherein the adjusting the phase difference includes adjusting a phase of the control signal such that the phase difference corresponds to the predetermined phase shift value.

19. The method of claim 18, further comprising locking the phase difference if the phase difference corresponds to the predetermined phase value.

20. The method of claim 17, further comprising:
performing frequency scanning to obtain a frequency response of the resonance system;
determining a resonance frequency and a phase shift range of the resonance system based on a system transfer function of the resonance system;
selecting an initial phase shift value from the phase shift range;
determining whether the initial phase shift value meets a control requirement;
adjusting the initial phase shift value if the initial phase shift value does not meet the control requirement; and
determining the predetermined phase shift value based on the initial phase shift value or the adjusted phase shift value that meets the control requirement.

* * * * *